United States Patent
See et al.

(10) Patent No.: US 7,268,374 B2
(45) Date of Patent: Sep. 11, 2007

(54) SEMICONDUCTOR DEVICE AND METHOD OF ITS MANUFACTURE

(75) Inventors: Patrick Un Siong See, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/075,700

(22) Filed: Mar. 10, 2005

(65) Prior Publication Data

US 2005/0233600 A1    Oct. 20, 2005

(30) Foreign Application Priority Data

Mar. 11, 2004    (GB) .................... 0405510.9

(51) Int. Cl.
*H01L 31/072*  (2006.01)
*H01L 31/109*  (2006.01)
*H01L 31/0328* (2006.01)
*H01L 31/0336* (2006.01)

(52) U.S. Cl. ........................ 257/188; 438/800
(58) Field of Classification Search ................ 257/188, 257/192, 194, 210; 438/800
See application file for complete search history.

(56) References Cited

U.S. PATENT DOCUMENTS 5,270,557 A    12/1993    Schmidt 6,657,222 B1 * 12/2003 Foden et al. ................ 257/13
2003/0128733 A1 * 7/2003 Tan et al. .................... 372/96
2003/0201459 A1 * 10/2003 Sheppard et al. ........... 257/194

FOREIGN PATENT DOCUMENTS

GB    2 341 722 A    3/2000

OTHER PUBLICATIONS

Eva M. Hoehberger, et al., "In situ control of electron gas dimensionality in freely suspended semiconductor membranes", Applied Physics Letters, vol. 82, No. 23, Jun. 9, 2003, pp. 4160-4162.
R.H. Blick, et al., "Freely suspended two-dimensional electron gases", Physica B, vol. 249-251, Jun. 1998, pp. 784-787.

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A semiconductor device comprising a vertical stack of layers, comprising:
  an active layer configured to support a two dimensional carrier gas having an excess of carriers;
  source and drain contacts provided to said active layer such that a current can flow between said source and drain contacts through said two dimensional carrier gas;
  a lower conducting region,
  wherein said lower contact conducting region is a patterned lower conducting region such that said active layer is suspended across gaps in said lower conducting region and said active layer is physically supported by and suspended between parts of said lower conducting region.

10 Claims, 14 Drawing Sheets

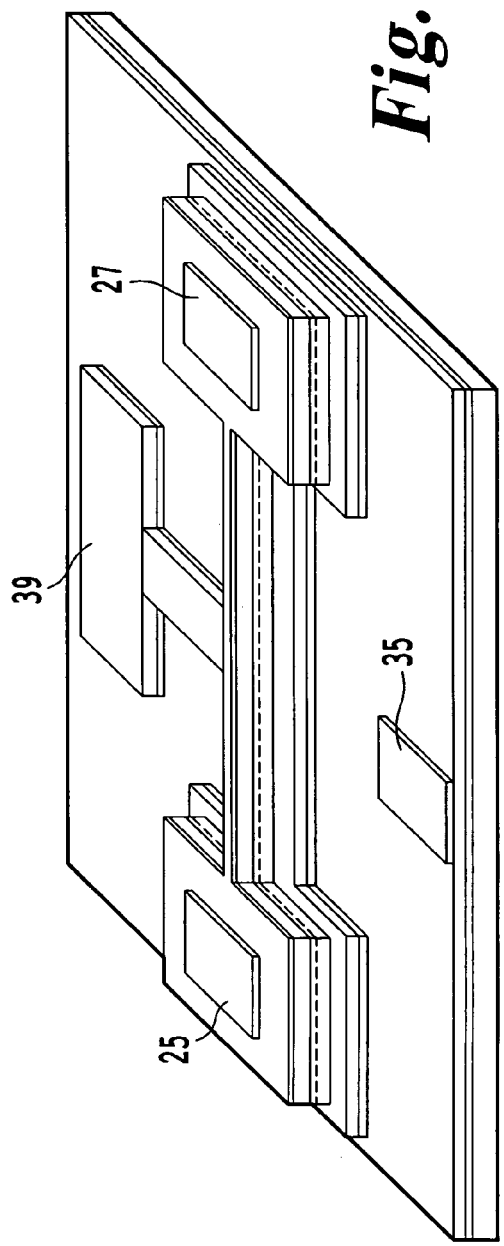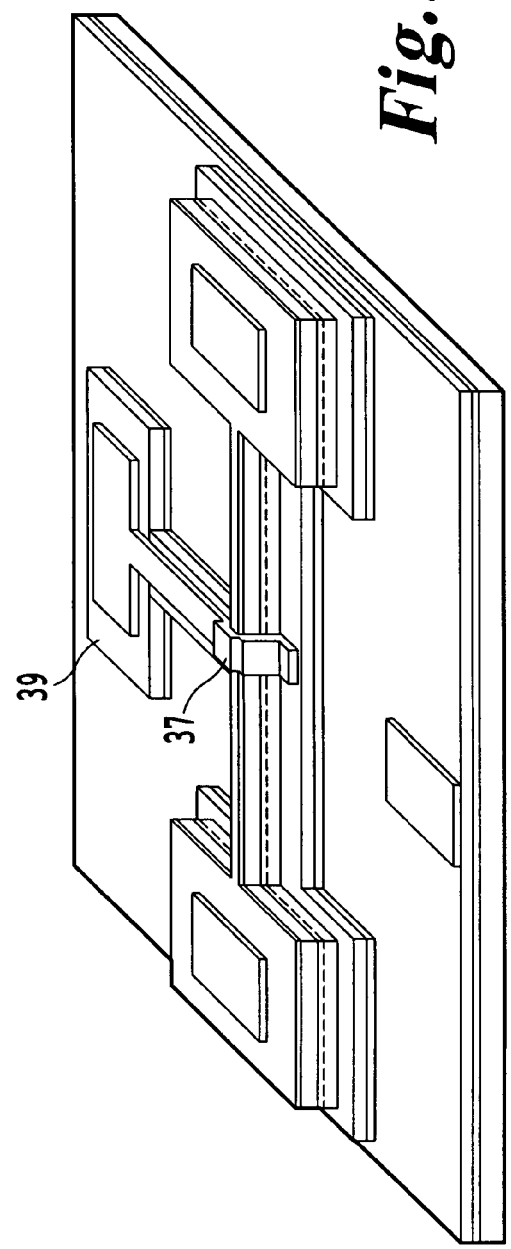

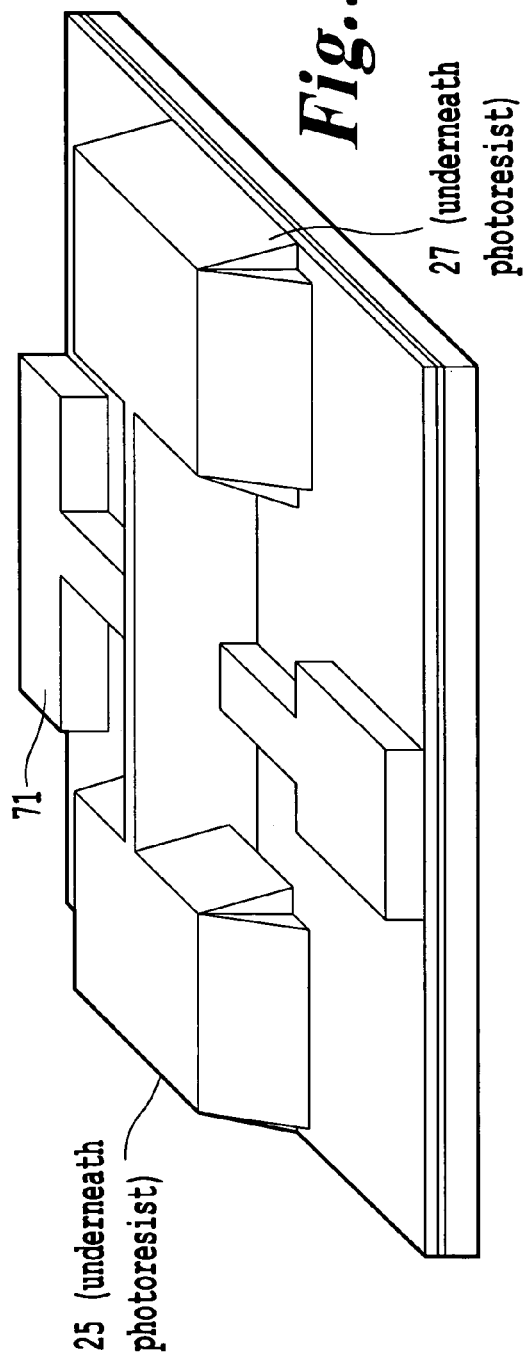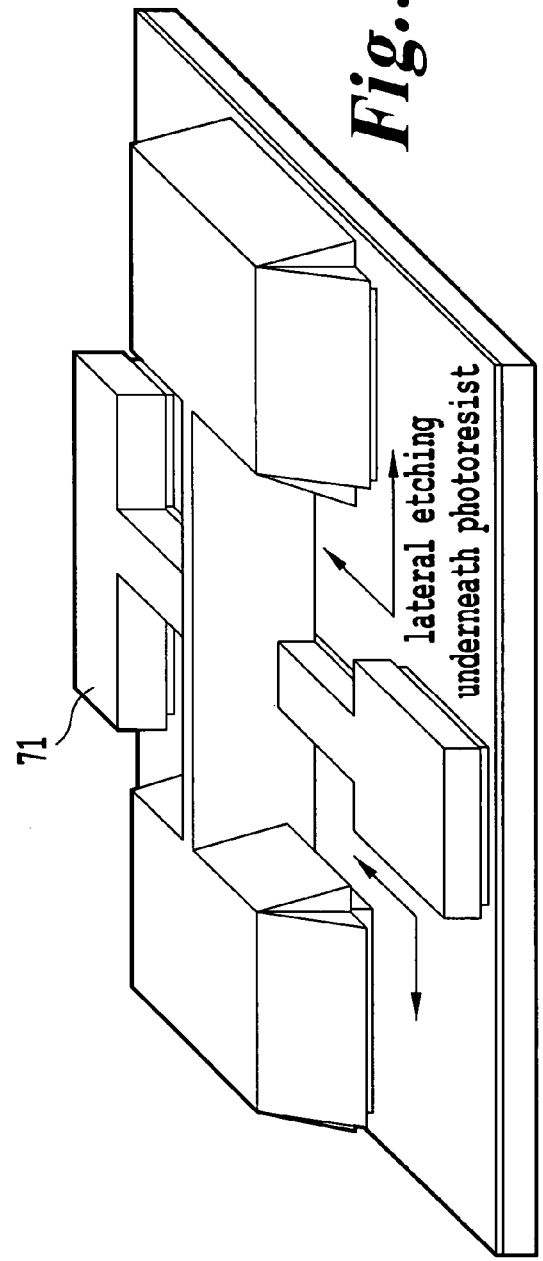

SEMICONDUCTOR DEVICE AND METHOD OF ITS MANUFACTURE

BACKGROUND OF THE INVENTION

The present invention relates to the field of semiconductor devices and their manufacture. More specifically, the present invention relates to the field of semiconductor devices which have multiple vertically stacked conducting layers and where contact needs to be made to two or more of these conducting layers.

Nearly all semiconductor devices comprise a plurality of vertically stacked layers. In some devices, for example, a field effect transistor (FET), there is a need to measure transport laterally through an active layer and to modulate this transport by applying a field using a further conductive layer or region within the device. To make contact to the active layer, a source contact and a drain contact are used.

If the further conductive layer or region is a semiconductor layer or region within the device, there is a problem in that the source and drain contacts can also connect to the contact region thus causing the device to short through the lower contact region.

Many solutions to this problem have been proposed, for example, the use of shallow ohmic contacts whose penetration can be controlled so that they only penetrate to the active layer. These contacts have the problem in that their penetration can be difficult to control and even if it if correctly controlled they still have a tendency to leak to the lower contact region. To minimise the problems of the contacts leaking or shorting, a relatively large distance is introduced between the active layer and the lower contact region, thus increasing the size of the device. In addition, a large operating voltage will be required that inevitably leads to other problems e.g. current leakage and heating.

Another conventional method is to use a conducting substrate as its lower contact region. However, this technique often still require the use of shallow ohmic contacts and hence the associated problems. Moreover, it is very difficult to align this ohmic contact on the back of the wafer substrate region with the active area of the device on the wafer surface.

Other techniques have involved complicated regrowth techniques such as those described in GB 2305003 or using highly specialized equipment such as in situ focused ion beam patterning (Linfield et al, Semicond Sci Tech vol. 8, pages 415-422 1993).

Previously, suspended structures have been used to test hypothesis, e.g. Blick et al. Phys. Rev. 62, pages 17103 to 17107 (2000) where a two dimensional electron gas (2DEG) is suspended in order to study both electrons and phonons. Other suspended structures, e.g. Itskevich et al, Appl. Phys. Lett. 76, pages 3932 to 3934 (2000) have not used a suspended structure to obtain lateral transport through a low dimensional carrier gas.

SUMMARY OF THE INVENTION

The present invention at least partially addresses the above problems and in a first aspect provides a semiconductor device comprising a vertical stack of layers comprising:

an active layer configured to support a two dimensional carrier gas having an excess of carriers;

source and drain contacts provided to said active layer such that a current can flow between said source and drain contacts through said two dimensional carrier gas;

a lower conducting region, wherein said lower conducting region is a patterned lower conducting region such that said active layer is suspended across gaps in said lower conducting region and said active layer is physically supported by and suspended between parts of said lower conducting region.

In a preferred embodiment, the device further comprises an upper etch stop layer, said upper etch stop layer being provided between said lower conducting region and the active layer, said lower conducting region comprising a first material and said upper etch stop layer comprising a second material, wherein said first material is etchable by a first etchant but resistant to a second etchant and said second material is etchable by the second etchant but resistant to etching by the first etchant. The provision of this upper etch stop layer allows the lower conducting layer to be etched laterally without the etch undercutting the active region. This upper etch stop layer may be purposely engineered into the structure or in some cases, exploited the use an integral layer that is native to the structure e.g. doped $Al_{0.33}Ga_{0.67}As$ region in an inverted high electron mobility transistor (HEMT). Also, this etch stop layer can be a superlattice matrix of the etch stop (e.g. AlAs) and back gate material (e.g. GaAs).

The semiconductor device further preferably comprises a lower etch stop layer, said lower etch stop layer being provided on the opposing side of said lower conducting region to said active layer, wherein said lower conducting region comprises a first material and said lower etch stop layer comprises a second material, wherein said first material is etchable by a first etchant but resistant to a second etchant and said second material is etchable by the second etchant but resistant to etching by the first etchant. The provision of the lower etch stop layer allows any lateral etching to progress more efficiently since the etch cannot significantly progress downwards due to the lower etch stop layer.

It should be noted that the etch stop layers are slightly etched by the etchants, however they provide considerably resistance to the first etchant.

Generally, a contact will be made to said lower conducting region and wherein said contact to said lower conducting region is provided in a first lateral part of said device and the source or drain contact is formed in a second lateral part of said device, wherein said lower conducting region is removed in an area between said first and second lateral parts such that first and second parts of said lower conducting region are isolated from one another. This complete removal of the lower conducting layer considerably reduces leakage from the source and drain ohmic contacts via the lower conducting layer.

The lower conducting region may comprise a single layer or may comprise a plurality of layers. The lower conducting region may be a back-gate layer and thus form a patterned back gate. Alternatively, the lower conducting region may be a second, lower, active region comprising an active layer configured to support a two dimensional carrier gas with an excess of carriers. Such a lower active region may be provided instead of or in addition to said back-gate. A patterned lower contact region may be used to allow independent contact to be made to parallel 2DEGs, one provided in the upper or first active region and the other provided in the lower active region.

The first active layer may be formed directly in contact with said upper etch stop layer or other layers may be formed in between.

The active layer may patterned to form an elongate section and said lower conducting region has at least a part with an elongate shape and wherein said elongate shapes cross one another. Preferably, the major axes of the elongate parts are formed substantially perpendicular to one another. The lower conducting region may have an ohmic contact at either end of the elongate section to test electrical conductivity throughout the length of the wire.

The semiconductor may also comprise a front gate provided overlying said active region.

Although the discussion has mainly concentrated on the active region comprising an excess of electrons, it may alternatively have an excess of holes. Preferably, the semiconductor device comprises a doped barrier layer configured to supply carriers, either electrons or holes, to said active region.

In a second aspect, the present invention provides a method of fabricating a semiconductor device, the method comprising:

forming a lower conducting region;

forming an active region overlying said lower conducting region, said active region being configured to support a two dimensional carrier gas having an excess of carriers;

defining a pattern in said lower conducting region such that said active layer is suspended across gaps in said lower conducting region and said active layer is physically supported by and suspended between parts of said lower conducting region and providing source and drain contacts to said active layer such that a current can flow between said source and drain contacts through said carrier gas.

Preferably, defining a pattern in said conducting region comprises etching vertically through said active region and then laterally etching said conducting layer underneath said active region to undercut and suspend said active region.

Although said active region is suspended and supported by the lower conducting layer, any gaps in the structure may be filled by an insulator. However, the suspended structure must still be supported in the absence of the insulator so that the active region is suspended in free air but supported naturally at both ends e.g. by the source and gate stack.

BRIEF DESCRIPTION OF THE DRAWINGS

The present invention will now be described with reference to the following preferred non-limiting embodiments in which:

FIGS. 3a to 3f are figures indicating different fabrication stages of the device shown in FIG. 2;

DETAILED DESCRIPTION

Figure 1:
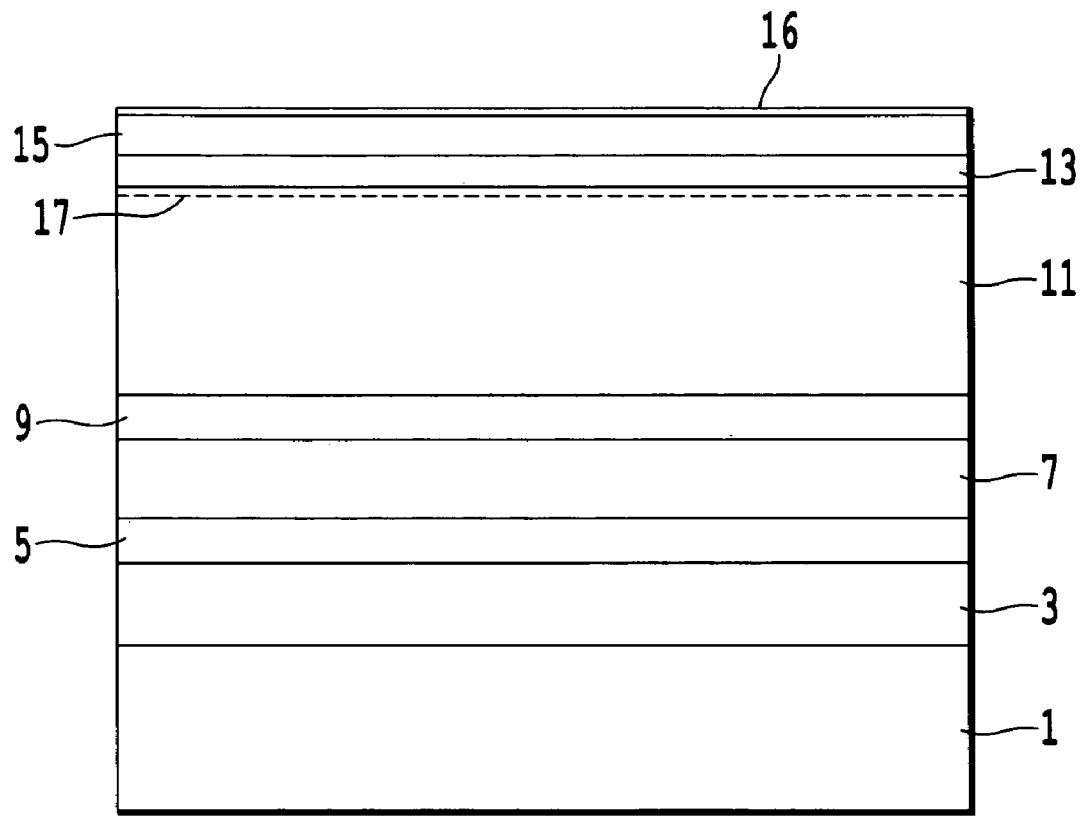
FIG. 1 is a layer structure of a device suitable for the present invention.

The layer structure of FIG. 1 comprises a semi-insulating GaAs substrate 1. An insulating GaAs buffer layer 3 is formed overlying and in contact with said substrate. A lower etch stop layer 5 comprising 50 nm AlAs is then formed overlying and in contact with said GaAs buffer layer 3. Lower contact region 7 is then formed overlying and in contact with lower buffer layer 5. Lower contact layer 7 comprises 100 nm of n-doped GaAs. Upper etch stop layer 9 is then formed overlying and in contact with the lower contact layer 7. Upper etch stop layer 9 comprises 50 nm of insulating AlAs.

Active layer 11 is provided overlying and in contact with upper etch stop layer 9. Active layer 11 comprises 250 nm of insulating GaAs. Spacer layer 13 is then provided overlying and in contact with active layer 11. Spacer layer 13 comprises 40 nm of undoped $Al_{0.33}Ga_{0.67}As$. Doped barrier layer 15 is then provided overlying and in contact with spacer layer 13. Doped barrier layer 15 comprises 40 nm of n-doped $Al_{0.33}Ga_{0.67}As$. Finally, the layer structure is finished with an insulating GaAs cap layer 16 which has a thickness of 10 nm and is formed overlying and in contact with said doped barrier layer 15.

Due to the differences in energy gaps between the active layer 11 and the spacer layer 13 and doped barrier layer 15, a quantum well is formed at the interface between active layer 11 and spacer layer 13. This quantum well is populated with electrons due to the doping provided by doped barrier layer 15 and thus supports a two dimension carrier gas or 2DEG 17 when the carriers are electrons. The spacer layer 13 serves to separate the doped barrier layer 15 from the active layer 11 as this is found to enhance mobility of the 2DEG 17.

The structure of FIG. 1 is based on a so-called back-gated high electron mobility transistor. The active layer, spacer layer and doped barrier layer 15 provide a high electron mobility transistor or HEMT. Electrons have a high mobility flow through the active layer along quantum well 17. The transport of these electrons is modulated by applying a bias to back gate 7. This structure varies from that of a standard HEMT in that lower 5 and upper 9 etch stop layers and back gate 7 are provided. The function of these layers will be described in more detail with reference to FIGS. 3a to 3f.

Other appropriate semiconductor device structures can be employed e.g. inverted 2-DEG HEMT, 2-DHG (double hole gas) HEMT, single wide GaAs quantum well or graded quantum well for velocity modulation transistors, etc. Also, other material system where the active back gate 7 can be selectively patterned by wet chemical etching between the etch stop layers 5 and 9 can be used e.g. InAs/AlSb, $GaN/Al_{1-x}Ga_xN$, $Si_{1-x}Ge_x/Si$, Si/SOI (silicon on insulator), $In_{1-y}Al_yAs/In_{1-x}Ga_xAs$, etc.

Figure 2:
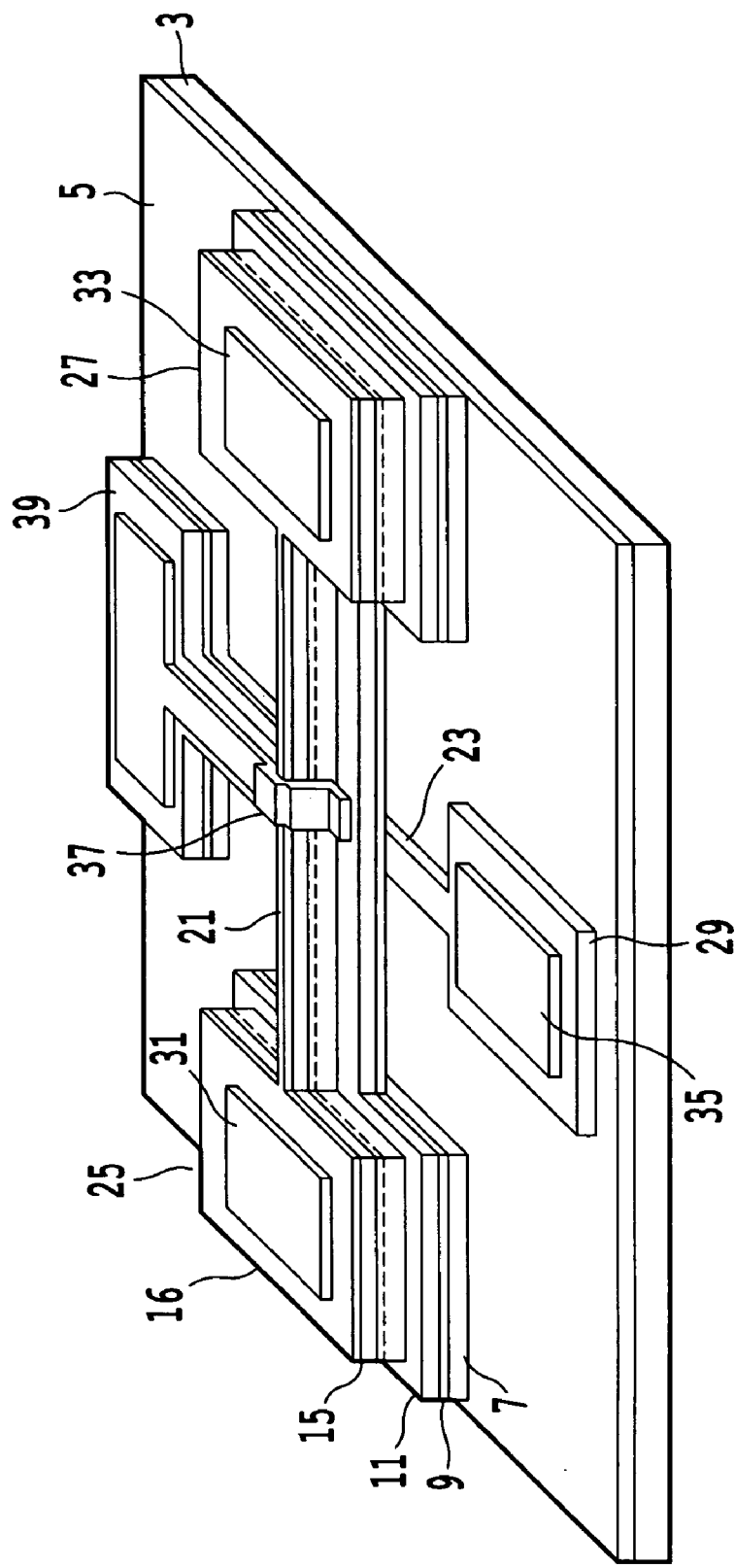
FIG. 2 is a schematic of a device in accordance with an embodiment of the present invention.

FIG. 2 is a schematic of a device in accordance with a preferred embodiment of the present invention. The semiconductor layer structure of the device is the same as that described with reference to FIG. 1 and to avoid unnecessary repetition, like reference numerals will be used to denote like features.

The device of FIG. 2 is in a so-called cross wire formation. An upper wire 21 which comprises layers from the upper etch stop layer 9 to the cap layer 16. A lower wire 23 is formed perpendicular to the upper wire 21. The lower wire 23 comprises just the back gate layer 7. The two wires are formed on the lower etch stop layer 5 which is in turn formed on the buffer layer 3 and substrate 1.

Upper wire 21 is connected to source contact stack 25 and drain contact stack 27. Source contact stack 25 comprises all of the layers down to lower contact layer 7. Similarly, drain contact stack 27 comprises all of the layers down to lower contact layer 7. Source contact stack 25 and drain contact stack 27 are connected by wire 21. Upper wire 21 does not contain lower contact layer 7 as this layer has been removed from under wire 21 such that wire 21 forms an air bridge between the source contact stack 25 and the drain contact stack 27. Source contact stack 25 and drain contact stack 27 both comprise lower contact region 7 so that the layers contained in wire 21 are suspended between two areas of the lower contact region 7 and are also physically supported by these two areas.

The lower contact wire 23 extends underneath the upper contact wire 21 and provides some further support for upper wire 21. Lower contact layer 7 contact pad 29 is connected to the lower contact wire 21.

A source ohmic contact is formed to the top of source contact stack 25. Source ohmic contact 31 can penetrate through the whole of source contact stack 25 because the lower contact region 7 and the source contact stack 25 is completely physically isolated from the lower contact region which forms lower wire 23. Similarly, a drain ohmic contact 33 is provided to the top of drain contact stack 27. Again, this drain ohmic contact can extend through all layers of contact stack 27.

A lower contact layer ohmic contact 35 is made to lower contact layer contact pad 29. In addition to the lower contact region 7 which will form a back gate, an optional front gate 37 is provided in the device of FIG. 2. The front gate 37 is formed overlying part of upper wire 21. The front gate 37 overlies a part of upper wire 21 which coincides with the lower wire 23. A front gate contact stack 39 is used to support the metal for front gate 37. Front gate contact stack 39 comprises the layers from lower contact region 7 up to part of active layer 11. The spacer 13 and upper doped barrier 15 are removed from front gate contact stack 39 to avoid the front gate leaking to these layers. The front gate metal 37 forms a pad on contact stack 39 and then the contact stack 39 and front gate metal 37 extend towards upper wire 21.

Due to the formation of front gate contact stack 39, a terrace is provided in active layer 11 of the upper wire 21 and source 25 and drain 27 contact stacks. The isolation etch which forms the terrace is not absolutely necessary but done to minimise any potential leakage from Schottky breakdown if the a top gate metal were located on the 10 nm i-GaAs. Depending on where the top gate metal is located, an optional dielectric/insulation layer may be co-evaporated underneath it to reduce potential leakage—not shown in the figures, similar to the idea of a polysilicon gate on a $SiO_2$ dielectric in a Si FET. However, the trade off will be a slight increase in the gate bias needed for operation.

The geometrical layout of the device presented is the simplest case with minimum number of ohmic contacts. Other designs e.g. Hall bars can be employed and the fabrication steps to realised such a device is essentially the same.

The fabrication of the device of FIG. 2 will be described with reference to FIGS. 3a to 3f. To avoid unnecessary repetition, like reference numerals will be used to denote like features. Also, it should be noted that the order of some of these steps may be interchanged e.g. FIG. 3b before 3a.

First, a mesa is defined to pattern the active layer. The mesa is in the shape of a wire 51 connecting first 53 and second 55 contact pads. The mesa etch is taken down to partway through active layer 11 so that the 2DEG 17 lies within the patterned region. The 2DEG is removed from all of regions, e.g. under the back gate contact and the front gate contact. Other device geometry can be adopted e.g. Hall bar.

The pattern for the mesa can be made using standard techniques for example, photolithography. A typical photolithography procedure to produce this pattern would require 500 nm of photoresist to be spun and patterned to form wire 51 and first and second pads 53, 55. The photoresist is patterned and then the structure is etched using either dry etching processes, e.g. $SiCl_4$ gas plasma or standard wet etching e.g. $H_2SO_4:H_2O_2:H_2O$. If it is desired for wire 51 to be very thin, it is desirable not to use an etching process which undercuts.

Once the active region mesa 57 is defined as described with reference to FIG. 3a, an isolation etch for the front gate is performed. As previously discussed, this step is optional. If not employed, the previous 2DEG wire mesa of FIG. 3a etch should be taken all the way into the back gate layer 7 and then the front metal gate should have an underlying dielectric/insulator layer sandwiched between it and the underlying back gate to avoid leakage when a large bias is applied.

Figure 3A:
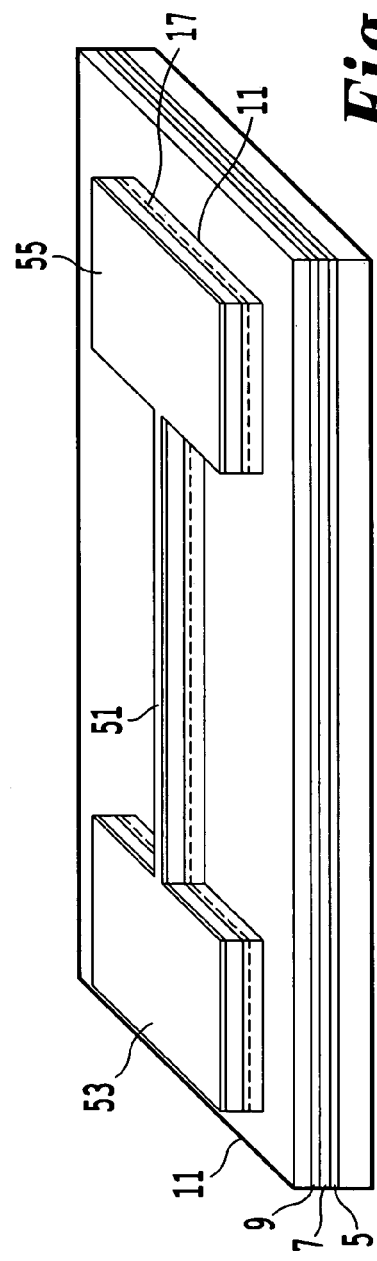
Figure 3B:
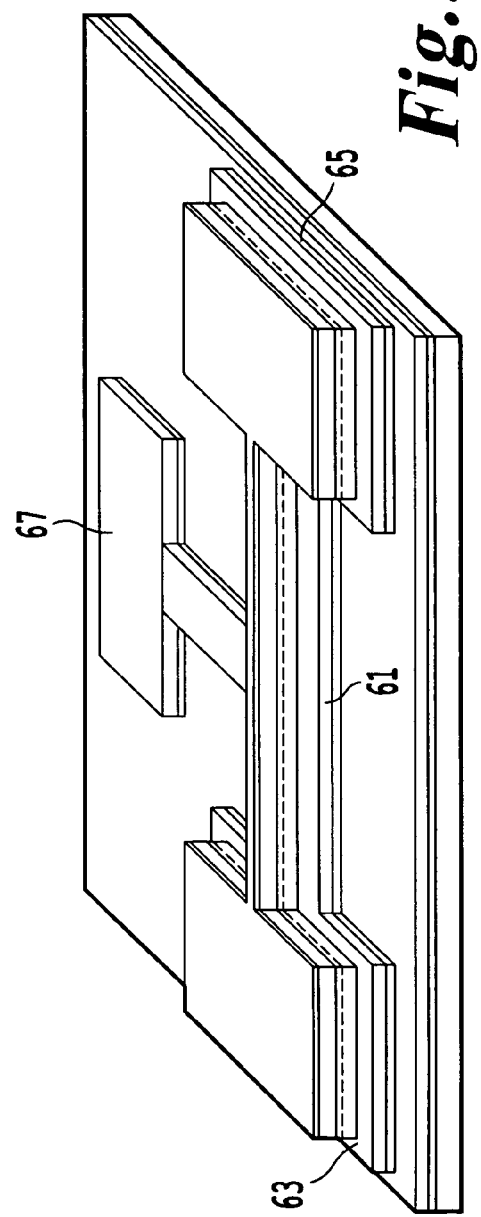

A mesa is defined with a slightly wider wire 61 than that defined in FIG. 3a. The wire 61 again connects two contact stacks 63 and 65 which have a larger footprint than the contact stacks 53 and 55 of FIG. 3a. The two wires 51 and 61 together form upper wire 21 of FIG. 2. Similarly, contact stacks 53 and 63 form source contact stack 25 and contact stacks 55 and 65 form drain contact stack 27. A "T-shaped" structure 67 is also defined to act as the platform where the front gate contact will be located. This etch proceeds down to the lower contact layer 7. The patterning may be performed using standard photolithography. The etch may be a wet etch or dry etch. The etch should be a non-selective etch. By etching the structure twice, a terrace is formed.

In FIG. 3c, contacts are formed to the source and drain contact stacks 25 and 27 respectively. An ohmic contact 35 is also formed to the lower contact layer. The contacts are defined using a standard lift-off process. As in this particular example, the contacts are required to make contact to n-type layers, a series of metals namely Ni/AuGe/Ni/Au in this sequence are deposited by thermal evaporation without breaking a vacuum onto the predefined areas. The alloy is then annealed at 400° C. for 60 seconds in forming gas. Any other suitable alloy which forms ohmic contacts to n-type GaAs can be used, for example, Pd/Ge or Ag/Ge.

In FIG. 3d, the front gate is formed. The front gate metallisation 37 is formed in a T-shape overlying the front gate mesa 35 formed with explanation to FIG. 3b. The front gate metallisation can be formed using a standard lift-off process and may be any suitable material which forms a Schottky contact with GaAs, for example NiCr/Au, Ti/Au, etc. An optional dielectric/insulator may be included underneath the metals to reduce leakage e.g. $Si_3N_4$, $SiO_2$, etc. For better front gate control, the i-GaAs cap 16 in FIG. 1 is removed/recessed and the front gate metal 37 rests on the underlying n-$Al_{0.33}Ga_{0.67}As$.

A thick photoresist layer is then spun over the structure. This is shown in FIG. 3e. A thick photoresist layer 71 may be 2.8 microns thick and is patterned so as to cover the mesas defined as explained with reference to FIGS. 3a and 3b and to define what will become the lower wire 21 and back gate contact pad 29. Due to the thickness of the photoresist, the photoresist extends slightly beyond the edge of contact stacks 25 and 27.

The structure of FIG. 3e is then etched as shown in FIG. 3f. The structure is etched using an isotropic etch such as $C_6H_8O_7$ and $H_2O_2$ (7:1 volume ratio). This isotropic etching preferentially removes GaAs only but not AlAs. Strictly speaking, the dissolution of AlAs does actually take place, but it is significantly slower than GaAs in the solution. Thus, the lower contact region 7 is etched. First, the etch proceeds downwards to remove unmasked regions of GaAs. The etch is stopped by lower etch stop layer 5. However, the etch will also proceed laterally and start to undercut the regions covered by photoresist 71. By making the upper wire 21 thin enough, the structure may be etched so that the parts of the lower contact region are completely removed from underneath the upper wire 21 thus isolating the parts of the lower contact region which form parts of contact stacks 25 and 27 and parts of the lower contact region which form the back gate contact 29.

In an alternative fabrication method, dry etching such as reactive ion etching (RIE) may be used to etch down to the lower AlAs etch stop layer to expose the back gate GaAs sidewalls underneath the resist. The structure is then laterally etched as described above.

Figure 4:
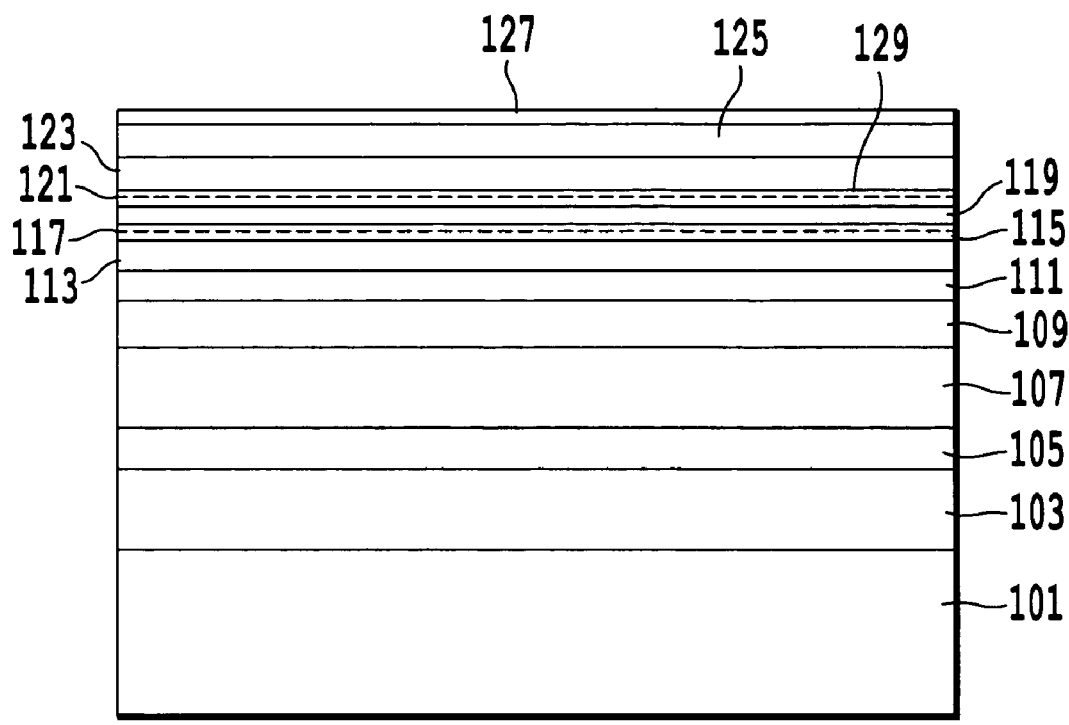
FIG. 4 is a layer structure of a further device suitable for use with the present invention.

FIG. 4 shows a further layer structure of a device which may be fabricated in accordance with a preferred embodiment of the present invention. The device is similar to that of FIG. 1. However, in this case, the layer structure has two carrier gases or 2DEGs (when the carriers are electrons). The layer structure comprises an insulating GaAs buffer layer 103 formed overlying and in contact with GaAs substrate 101. A lower etch stop layer 105 is then formed overlying and in contact with said buffer layer 103. Said etch stop layer 105 comprises 50 nm of insulating AlAs. Next, a GaAs back gate layer 107 is formed overlying and in contact with said lower etch stop layer 105. Said back gate layer 107 comprises 100 nm of n-doped GaAs. Upper etch stop 109 is then formed overlying and in contact with said back gate 107. Upper etch stop layer 109 comprises 50 nm of insulating AlAs.

A lower doped barrier layer 111 is then formed overlying and in contact with said upper etch stop 109. Lower doped barrier layer 111 comprises 40 nm of n-doped $Al_{0.33}Ga_{0.67}As$. Next, lower spacer layer 113 is then formed overlying and in contact with lower doped layer 111. Lower spacer layer 113 comprises 40 nm of insulating $Al_{0.33}Ga_{0.67}As$.

Lower active layer 115 comprises 20 nm of insulating GaAs. Due to the presence of lower doped barrier layer 111, a two dimensional electron gas 117 is formed in lower active layer 115. Middle undoped barrier layer 119 is then provided overlying and in contact with said lower active layer 115. Said middle barrier comprises 20 nm of insulating $Al_{0.33}Ga_{0.67}As$. Next, upper active layer 121 is provided overlying and in contact with middle barrier layer 119. Upper active layer 121 comprises 20 nm of insulating GaAs. Upper spacer layer 123 is then provided overlying and in contact with said upper active layer 121. Upper spacer layer 123 comprises 40 nm of insulating $Al_{0.33}Ga_{0.67}As$. Upper doped barrier layer 125 is then provided overlying and in contact with said upper spacer layer 123. Said upper doped barrier layer 125 comprises 40 nm of n-doped $Al_{0.33}Ga_{0.67}As$.

Finally, the structure is finished with a GaAs cap layer 127 which comprises 10 nm of insulating GaAs and is formed overlying and in contact with upper barrier layer 125. A 2DEG 129 is formed in the upper active layer 121. The 2DEG is doped with carriers from upper doped barrier layer 125. Upper quantum well layer 121, upper spacer layer 123 and upper doped barrier layer 125 together form a standard HEMT structure. An inverted HEMT structure is formed by lower quantum well layer 115, lower spacer layer 113 and lower doped barrier layer 111. Again, a 2DEG 117 is formed in the lower quantum well layer 115 and this 2DEG is doped with excess carriers from lower doped barrier layer 111.

Figure 5:
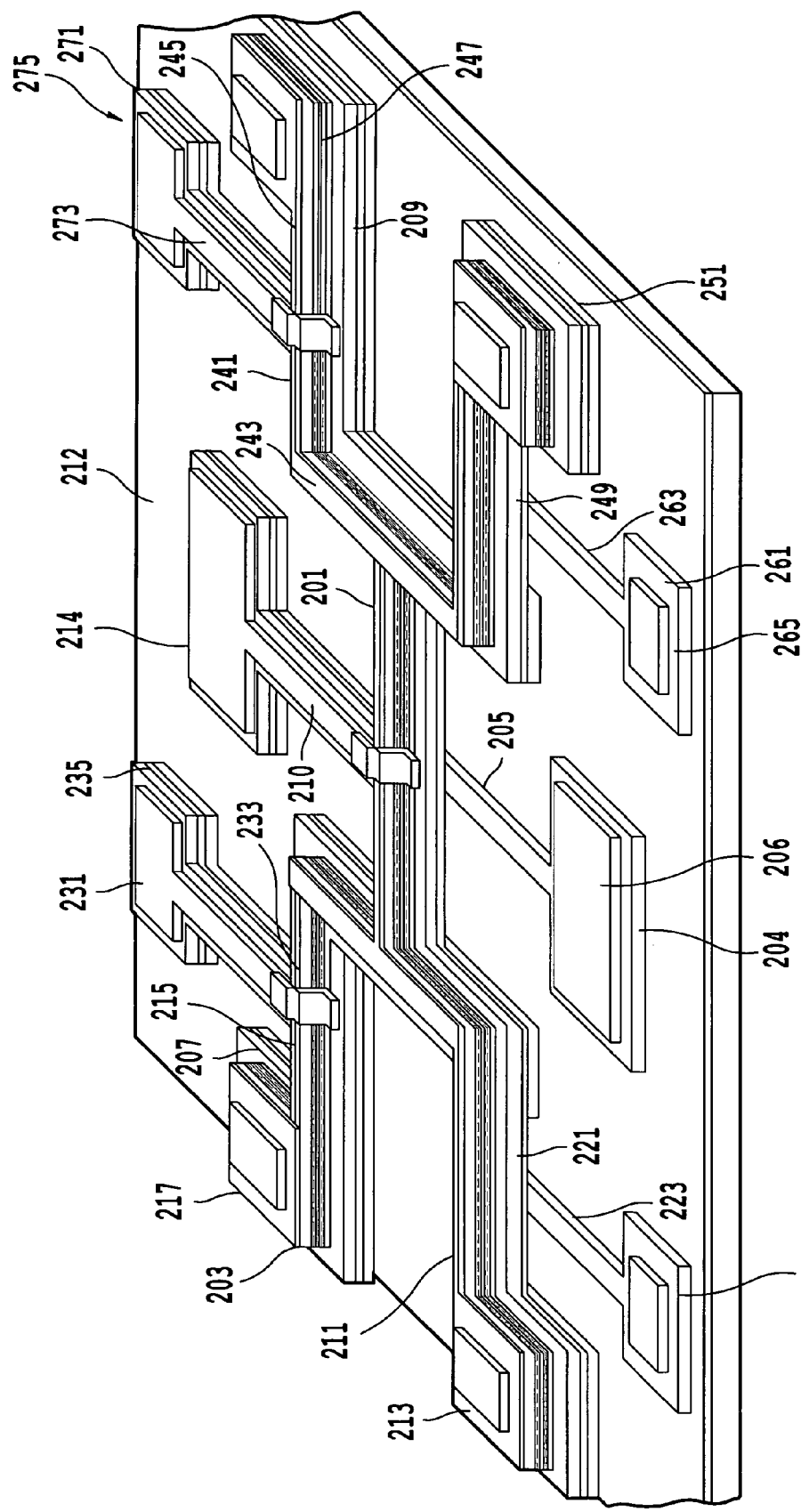
FIG. 5 is a schematic of a device in accordance with a further embodiment of the present invention.
Figure 6:
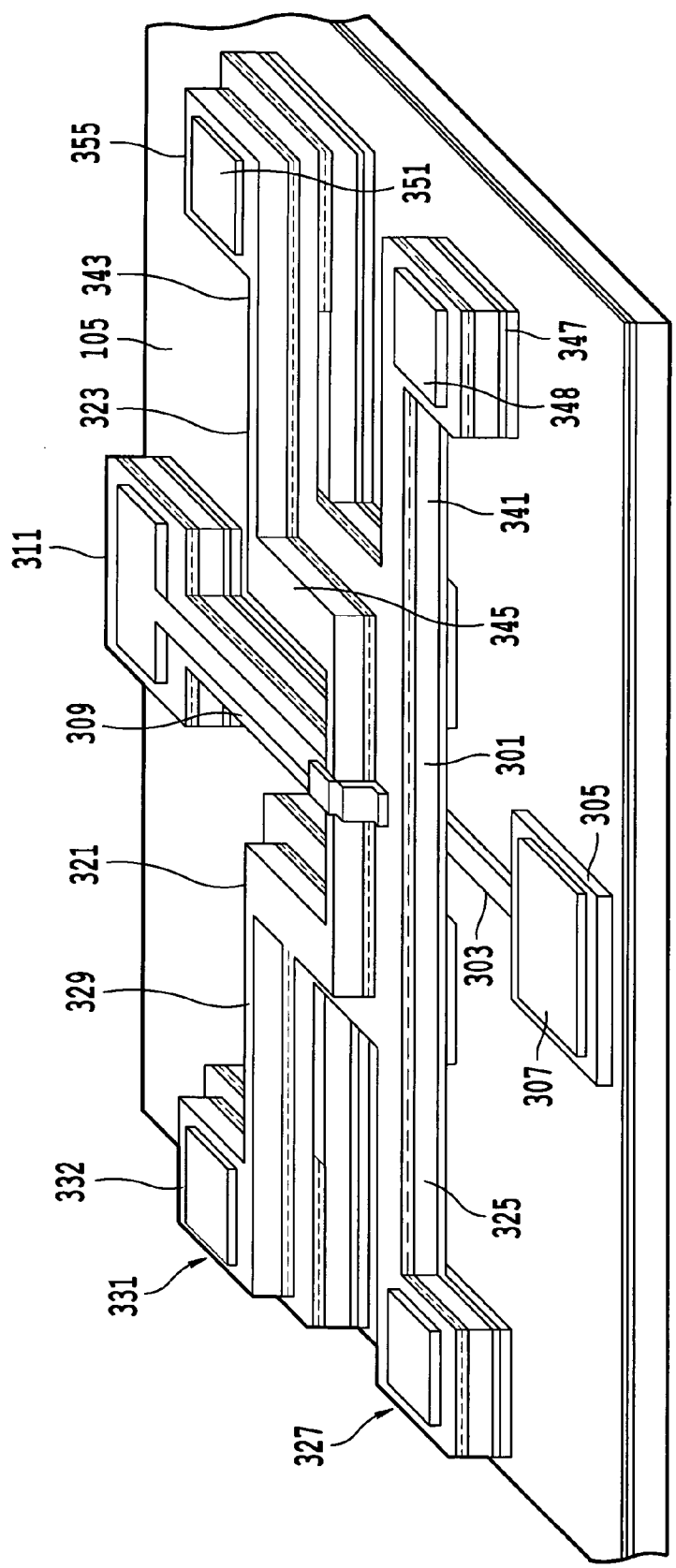
FIG. 6 is a schematic of a device in accordance with a further embodiment of the present invention.

In accordance with embodiments of the present invention, the double 2DEG structure of FIG. 4 may be fabricated into a double 2DEG field effect transistor which allows independent contacting of the two 2DEGs using depletion gates as shown in FIG. 5 or which allows independent contacting without using the depletion gates as shown in FIG. 6.

The double 2DEG with depletion gates as shown in FIG. 5 is of a similar design to the single 2DEG as shown in FIG. 2. There is an upper wire 201 which forms part of upper structure 203. A lower wire 205 is arranged in a crosswire formation with upper wire 201. Upper wire 201 comprises all the layers from cap layer 127 to upper etch stop layer 109 (shown in FIG. 4).

Lower wire 205 comprises just back gate layer 107 (shown in FIG. 4). The lower wire 205 contacts back-gate contact pad 204. Main back gate ohmic contact 206 is provided to back-gate contact pad 204 in order to make electrical connection to lower wire 205.

As for the device of FIG. 2, a front a front gate 210 is provided in the device of FIG. 5. The front gate 210 is formed overlying part of upper wire 201. The front gate 210 overlies a part of upper wire 201 which coincides with the lower wire 203. A front gate contact stack 212 is used to support the metal for front gate 210. Front gate contact stack 212 comprises the layers from lower contact region 107 up to part of lower active layer 115. The front gate metal 210 forms a pad 214 on contact stack 212 and then the contact stack 212 and front gate metal 210 extend towards upper wire 201.

The upper wire 201 forms part of upper structure 203. Instead of terminating in a single source contact stack and a single drain contact stack as described with reference to FIG. 2, the upper wire 201 contacts a source section 207 at one end and a drain section 209 at the other end. Source section 207 comprises an essentially squared U-shaped narrow wire. Upper wire 201 contacts source section 203 at the centre of the "U". One arm 211 of the "U" terminates in upper 2DEG source contact stack 213 and the other arm 215 of the "U" terminates in lower 2DEG contact stack 217.

Upper 2DEG source contact stack 213 and lower 2DEG source contact stack 217 comprise all of the layers from upper cap layer 127 down to back gate layer 107. The first arm of the "U" which connects to upper 2DEG contact stack 213, forms a suspended bridge from the lower part of U-shaped section 207 to upper 2DEG contact stack 213. In this region, the back gate layer is removed from all areas except for a section 221 where it partially supports first arm 211.

At section 221, there is a lower wire of back gate 223 which is connected to a lower wire first back depletion gate 225. First back depletion gate 225 may be biased so that a field is applied to upper and lower 2DEGs such that the lower 2DEG is depleted out but not the upper 2DEG. This allows source upper 2DEG contact stack 213 to only make contact to the upper 2DEG if a sufficient field is applied to lower 2DEG depletion gate 225.

Wire 215 which connects that lower part of the "U" to source lower 2DEG contact stack 217 comprises all of the layers from the back gate to the upper cap layer. A front depletion gate 231 is provided which comprises front gate metal 233 connected to a front gate contact stack 235. The gate metal 233 overlies a part of arm 215. By applying a bias to front gate contact stack 235, the top 2DEG can be depleted out. Thus, electrical contact between the lower part of U-shaped section 207 and lower 2DEG contact stack 217 through the lower 2DEG.

At the opposing side of upper wire 201, drain contact section 241 is positioned. Similar to source contact section 207, drain contact section 241 comprises a U-shaped wire structure 243 connected at the middle of the U to upper wire 201. The first arm 245 of the drain contact section 241 is connected to lower 2DEG drain contact 247. The second arm 249 of the drain contact section 241 is connected to the U-shaped part of drain contact section 243 and drain upper 2DEG contact stack 251.

As described with reference to the source contact stacks 213, 217, the drain contact stacks 247 and 251 may connect with the different 2DEGs by virtue of depletion gates. A lower 2DEG depletion gate 261 is provided which comprises a wire 263 of back gate material connected to a contact pad 265. Second arm 249 is suspended across this lower wire 263 such that the lower wire only underlies part of second arm 249. By applying a suitable bias to contact pad 265, it is possible to deplete out the lower 2DEG and hence allow only conduction along arm 249 through upper 2DEG.

Similarly, an upper 2DEG depletion gate 271 is provided on first arm 245. Upper 2DEG depletion gate 271 comprises a front gate 273 connected to front gate contact stack 275. Front gate contact stack 275 allows contact to front gate 273 to be made.

FIG. 6 shows a further device in accordance with a preferred embodiment of the present invention which is fabricated from the layer structure of FIG. 4. The device differs from that described with reference to FIG. 5 in that the device does not have depletion gates on the source and drain connection sections. Instead, the upper or lower 2DEG is removed from certain regions in order to allow independent contact to the two 2DEGs to be made.

The layers above lower etch stop layer 105 are patterned to form essentially a crosswire arrangement with an upper wire 301 arranged perpendicular to a lower wire 303. Upper wire 301 comprises layers from cap layer 127 to upper etch stop layer 109. Lower wire 303 comprises back gate layer 107. The arrangement of upper wire 301 and lower wire 303 is similar to that described with reference to FIG. 2 in that the upper wire 301 is suspended between regions of back gate layer 107.

The lower wire 303 provides a portion of the back gate which lies underneath upper wire 301. Lower wire 303 terminates at a back gate contact pad 305 to which external contact is made via ohmic contact 307 provided in the centre of back gate contact pad 305. In addition to back gate wire 303, a front gate wire 309 is provided overlying a part of upper wire 301. Front gate wire 309 terminates in front gate contact pad 311. The front gate contact pad is supported by a stack of layers from lower 2DEG layer 115 to back gate layer 107.

An alternative further fabrication step (not shown) is to further recess the mesa stack 311 on which the front gate 309 is located way into the i-GaAs buffer 103. Another option is to use a dielectric/insulator under the front gate 309 to avoid any potential detrimental effects from the front gate being located just above the lower 2DEG.

The upper wire 301 terminates at one end with a source contact structure 321 and at the opposing end with a drain contact stack structure 323. The source contact structure is essentially a squared U-shape and upper wire 301 contacts the source contact structure 321 at one side of the bottom arm of the "U". A first arm of the "U" 325 terminates in a source lower 2DEG contact stack 327 and a second arm of the "U" 329 terminates in a source upper 2DEG contact stack 331. A different geometry may be employed e.g. Hall bar.

The source lower 2DEG contact stack 327 and the first arm 325 comprise the layers from the middle barrier layer 119 to the upper etch stop layer 109. In addition, the contact stack 327 also comprises back gate layer 107. The back gate layer 107 is removed from underneath the first arm 325 so that the first arm is suspended between sections of the back gate layer provided underneath contact stack 327 and underneath the lower arm of U-shaped source contact structure 321. The layers above the middle barrier layer 119 have been removed so that there is only a single lower 2DEG layer in this part of the structure and thus contact made to lower 2DEG source contact stack 327 only connects to the lower 2DEG and not the upper 2DEG.

Similarly, second arm 329 of source contact section 321 is connected to upper 2DEG source contact stack 331. Arm 329 comprises all layers from upper cap layer 127 to back gate layer 105 except for lower 2DEG layer 115. Lower 2DEG layer 115 is removed from part of the arm so that the layers from the middle barrier 119 to the upper cap layer 127 are suspended and form an air bridge bridging two parts of lower 2DEG layer 113. An ohmic contact 332 is made to source upper 2DEG contact stack 331. This ohmic contact can connect to both the upper 2DEG and the lower 2DEG since both these layers are present in upper 2DEG source contact stack 331. However, since the lower 2DEG layer is removed from arm 329, the source contact 332 only makes contact to the upper 2DEG layer.

Drain contact region 323 is again substantially a squared U-shape comprising a first arm 341, a second arm 343 and a lower section 345 joining arms 341 and 343. The upper wire 301 connects to drain contact section 323 at the junction between lower connecting arm 345 and first arm 341. Again, a different geometry may be employed e.g. Hall bar, etc.

First arm 341 is connected to the lower 2DEG drain contact stack 345. The first arm 341 is connected to lower 2DEG drain contact stack 347. The first arm 341 comprises the layers from middle barrier layer 119 down to upper etch stop layer 109. The back gate layer 107 is removed from underneath arm 341 such that arm 341 is suspended and forms an air bridge between two sections of the back gate layer 107 formed underneath connecting arm 345 and in drain contact stack 347. Since the upper 2DEG layer is missing from this section, ohmic contact 348 provided on lower 2DEG drain contact stack 347 only connects to the lower 2DEG layer.

Similarly, second arm 343 is connected to upper 2DEG contact stack 345. The lower 2DEG layer has been removed from second arm 343 so that there is no electrical connection through this layer along arm 343. Upper 2DEG drain contact stack 345 comprises all the layers from cap layer 127 down to back gate layer 107.

A contact 351 provided to drain contact stack 355 will contact both the upper and lower 2DEG layers. However, due to the discontinuity in the lower 2DEG layer, charge cannot flow through the lower 2DEG layer from the drain contact stack to upper wire 301.

FIGS. 7a to 7g schematically indicate the fabrication steps in fabricating the structure of FIG. 6. To avoid unnecessary repetition, the details of the etches will not be repeated, but the same considerations are required as those for etching the structure of FIG. 2. Where necessary, the details of the etches are provided.

First, a source and drain channel is defined to isolate the upper 2DEG. The etch is taken down to the middle barrier layer 119 of the layer structure of FIG. 4. Since the middle barrier layer 119 can be quite thin and unless the etching is well controlled to stop in this region, a highly controlled selective etch may be necessary. For example, the etchant $C_6H_7O_2:H_2O_2$ removes the i-GaAs cap 127 but does not etch the underlying $Al_{0.33}Ga_{0.67}As$ layers 125 and 123, which are in turn dissolved by dilute HF or concentrated HCl but does not affect the underlying upper i-GaAs quantum well 121, followed by another $C_6H_7O_2:H_2O_2$ to remove this layer 121 (FIG. 4). Central wire 401 is connected to a source contact structure 403 at one end and a drain contact structure 405 at the other end. Source contact structure 403 comprises the bottom section and the second arm of a U. The second arm is connected to upper 2DEG contact stack 407. Similarly, drain section 405 comprises the bottom section of a "U" and the second arm (as identified in FIG. 6) connected to a drain contact stack 409.

Figure 7A:
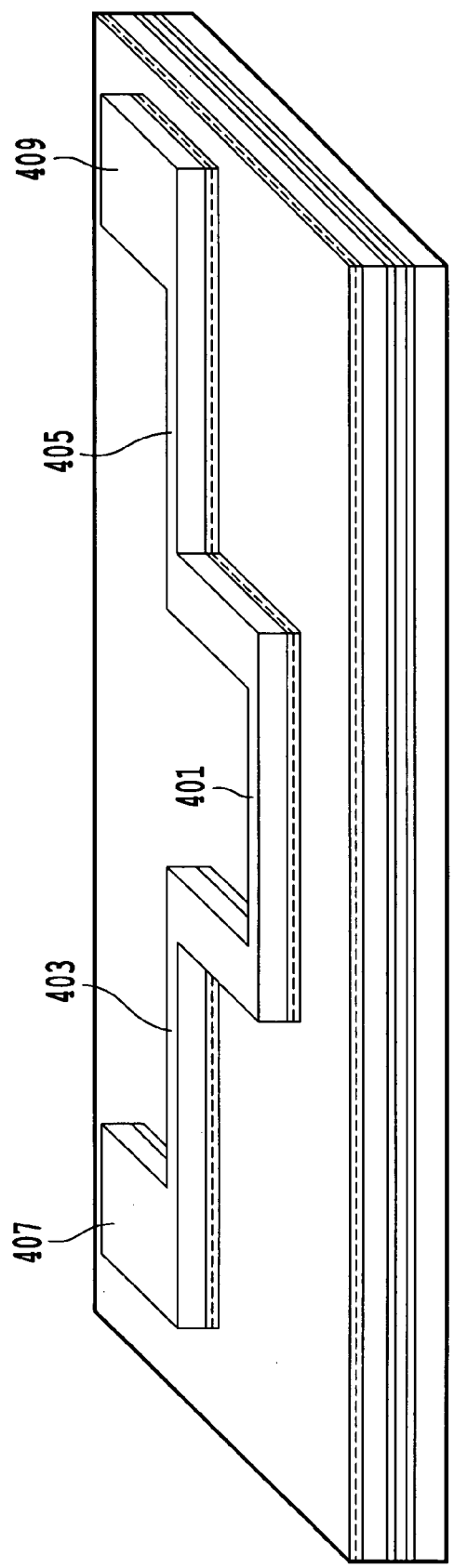
FIGS. 7a to 7f are figures indicating different fabrication stages of the device shown in FIG. 6.
Figure 7B:
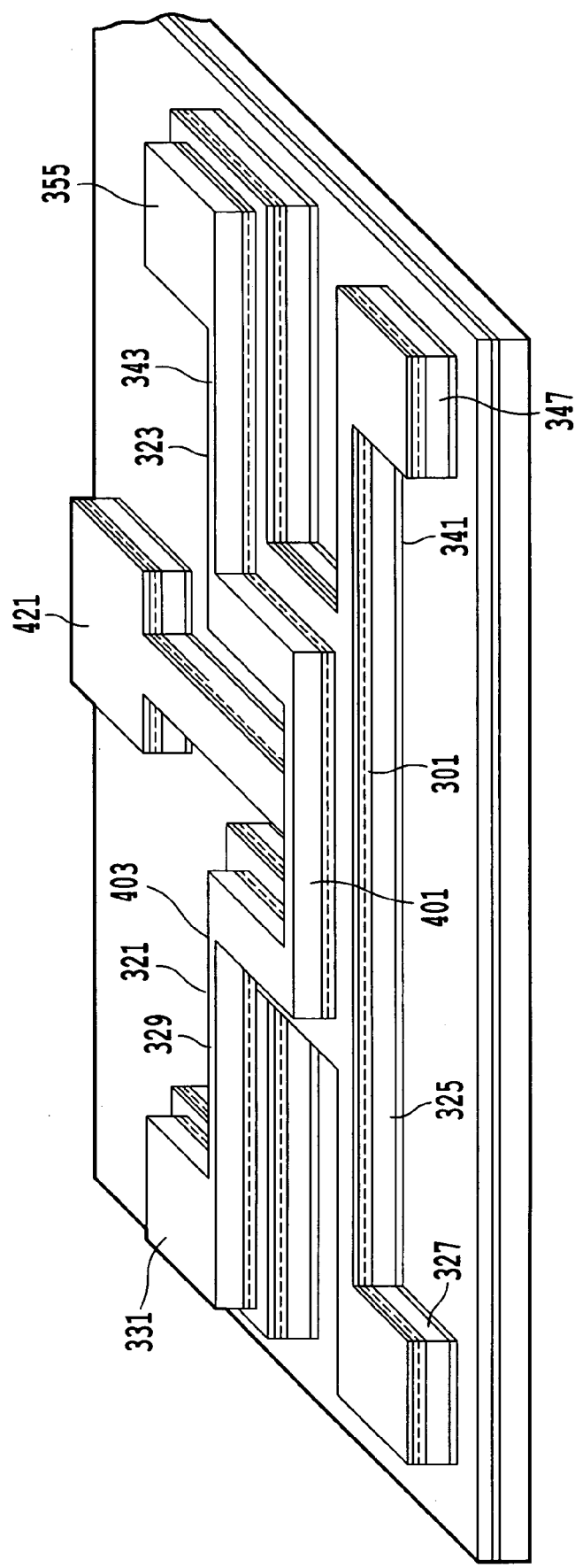

Next, as shown in FIG. 7b, the lower 2DEG layer is patterned. The etch is taken down past the upper etch stop layer 109 and into the n-GaAs back gate 107.

FIG. 7b shows the next etch stage. After patterning the top 2DEG layer, the lower 2DEG layer is patterned. The structure of the bottom 2DEG layer can be recognised from that of FIG. 6. Wire 401 is etched down to back gate layer 107. This deeper etched wire forms upper wire 301 of FIG. 6. This wire is then connected at one end to source contact section 321 and drain contact section 323. Both the source contact section and drain contact section are U-shaped structures comprising a first arm 325 and a second arm 329 for the source and a first arm 341 and a second arm 343 for the drain. Considering the source section 321, the first arm 325 which comprises the layers from the upper etch stop layer 109 to middle barrier layer 119 are connected to lower 2DEG contact stack 327. Since the upper 2DEG layer is not present in the lower 2DEG contact stack 327 and first arm 325, this layer cannot be contacted using either of these parts of the structure.

The second arm of the structure 329 comprises the layers from the middle barrier layer 119 to the upper etch stop layer 109 and further comprises the layers of the upper FET as defined as wire 403 in FIG. 7a.

Similarly contact stack 331 comprises the layers from middle barrier layer 119 down to first etch stop layer 109 and also the layers patterned to make the source contact stack 407 in FIG. 7a. At the moment, source contact stack 331 and first arm 321 comprise both the upper 2DEG and the lower 2DEG layers.

The drain contact section 323 is etched in a similar manner to the source contact section 321 and comprises first arm 341 connected to lower 2DEG drain contact stack 347 which is identical in construction to lower source contact stack 327. Similarly, second arm 343 is connected to drain contact stack 355.

In addition to the source contact section 321 and the drain contact section 323, in this step, a front gate contact section is also defined by etching a T-shaped structure 421 from middle barrier layer 119 to lower etch stop layer 109. The crossbar of the T-section 421 provides a contact pad and the wire extending from the crossbar of T-section 421 provides support for the later to be fabricated front gate metal.

Figure 7C:
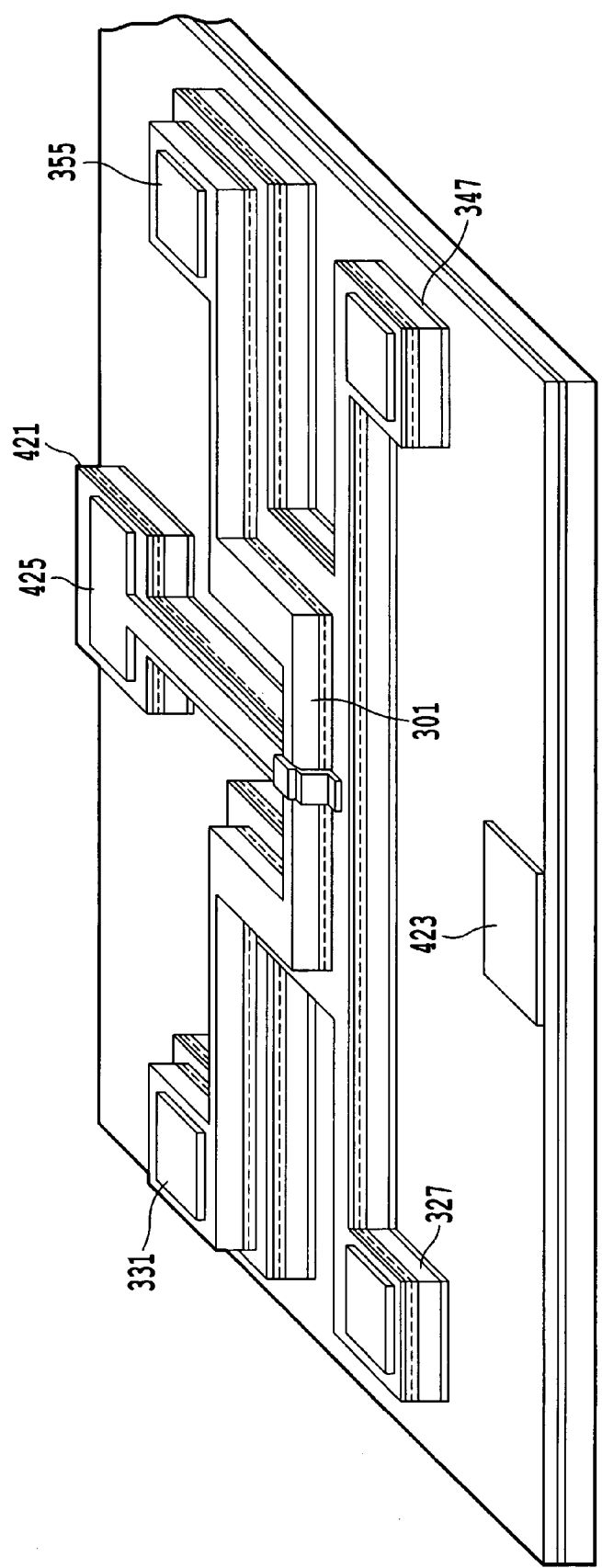

Next, the contacts are defined as shown in FIG. 7c. Ohmic contacts are made to each of the contact stacks 327, 331, 347 and 355. Also, a back gate contact is provided opposing front gate contact pad 421. Back gate contact 423 is formed directly to patterned back gate layer 107, which is eventually patterned into pad 305 of FIG. 6.

The ohmics are formed and annealed as described with reference to FIG. 3. Then a top gate Schottky metallisation is provided over the front gate contact pad 421 and extending wire such that a front gate extends over part of wire 301.

Figure 7D:
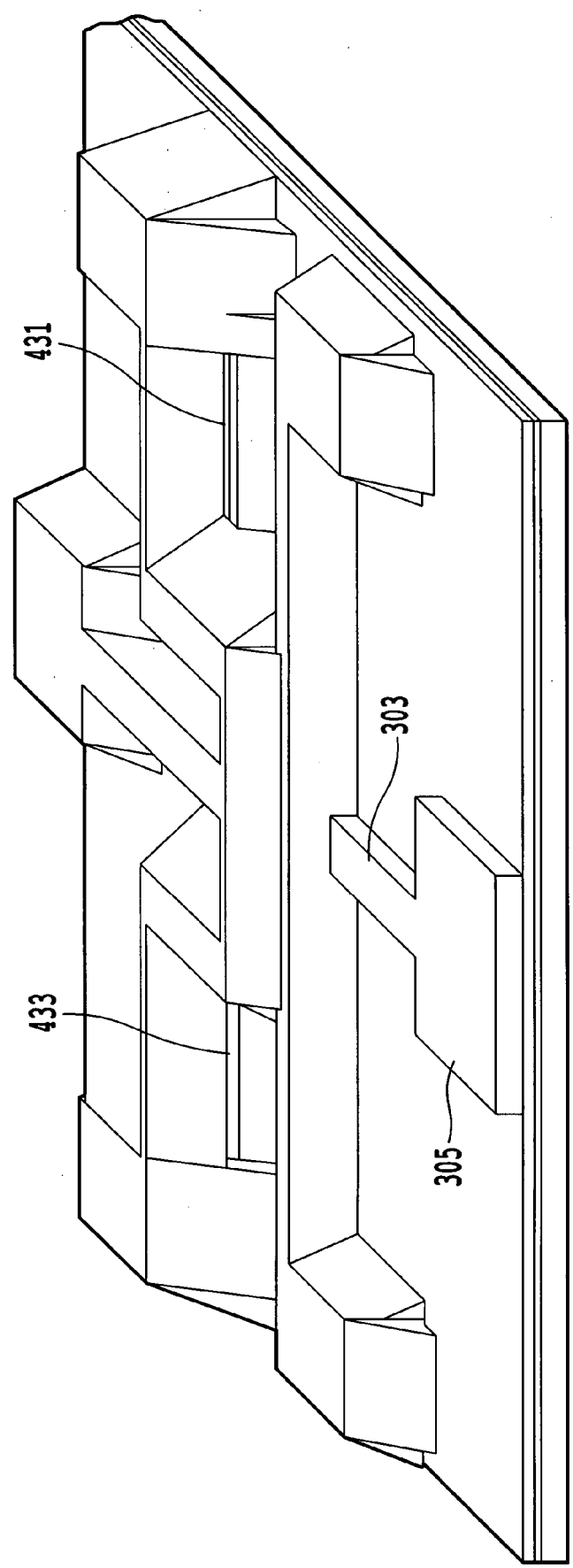

Next, the structure is covered in a thick photoresist and patterned optically as shown in FIG. 7d. Also, this photoresist is patterned to define lower wire 303 and back gate contact pad 305.

When the mesa for the second 2DEG is etched as shown in FIG. 7c, a terrace is formed with the upper layer of the terrace being middle barrier layer 119. When the photoresist is patterned as shown in FIG. 7d, parts of this terrace 431 and 433 are left exposed.

Figure 7E:
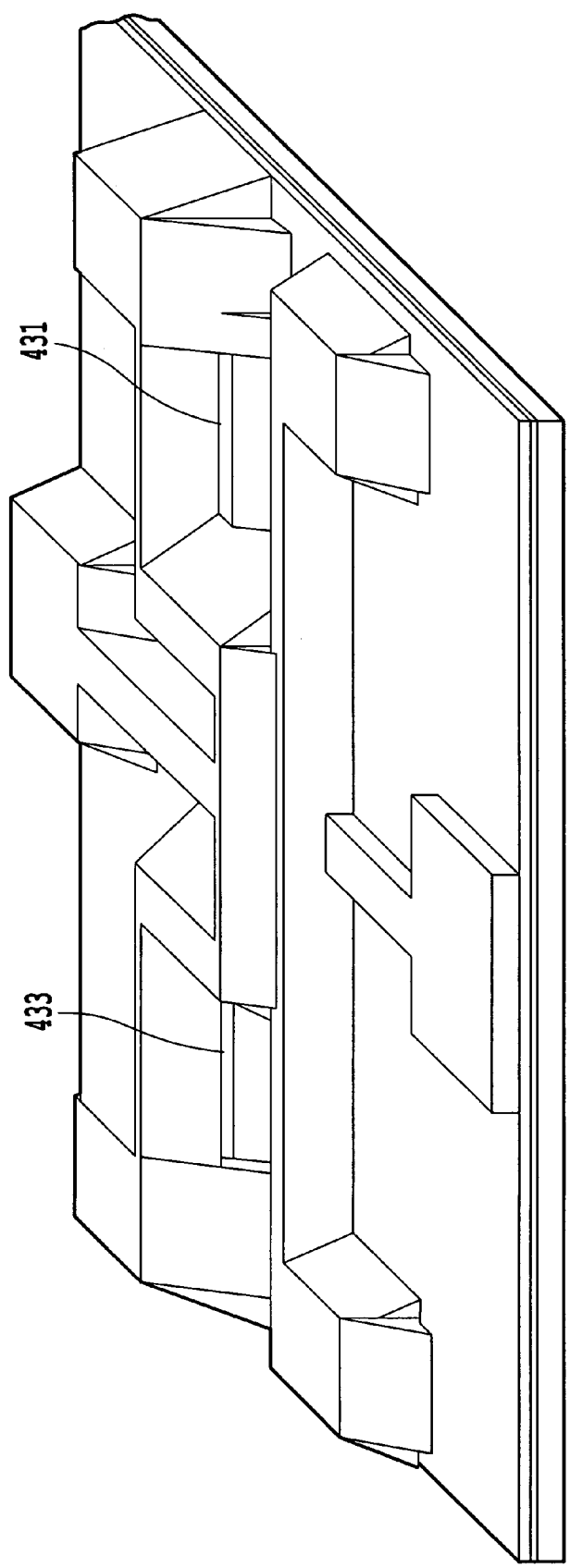
Figure 7F:
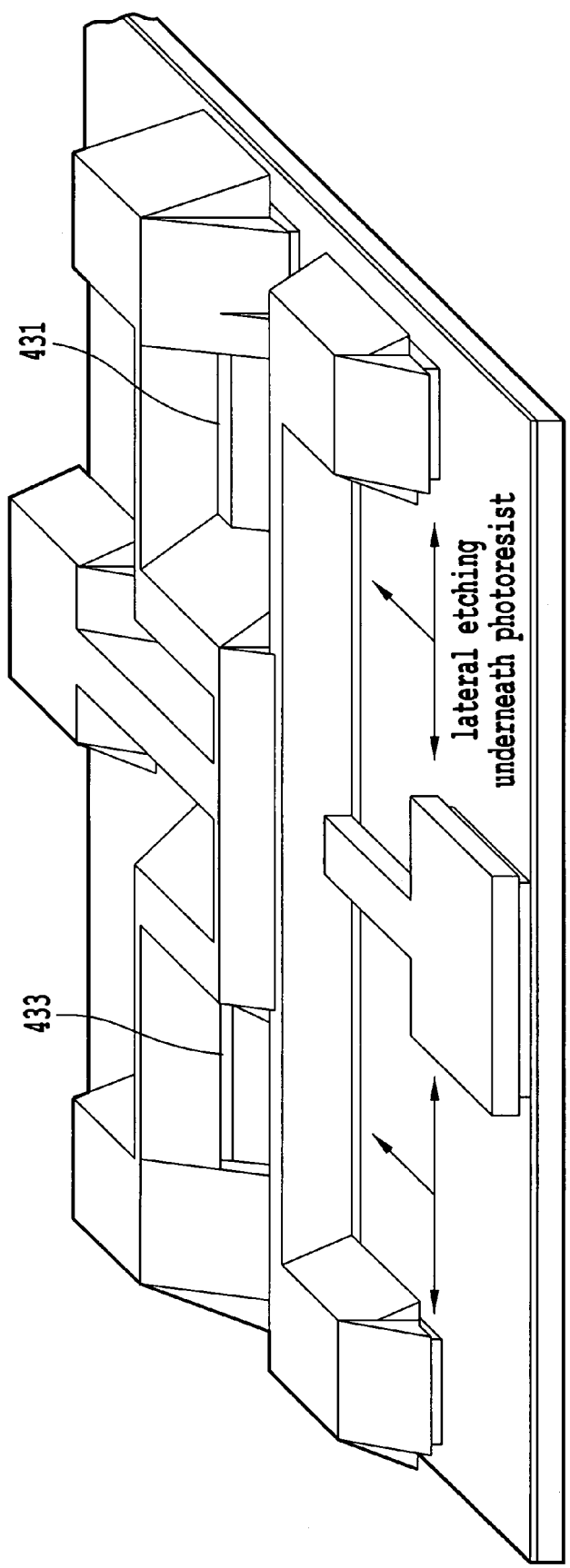

A selective etch is then used to remove AlAs exposed sections 431 and 433 as shown in FIG. 7e. Next, a selective etch is used which attacks GaAs but not the underlying $Al_{0.33}Ga_{0.67}As$. This etches through the back gate layer 107 down to lower AlAs etch stop layer 105. This etch also etches the exposed lower 2DEG layer in regions 431 and 433. The etch then proceeds to undercut the GaAs regions at regions 431 and 433 and the back gate regions which underlie the wires. These regions are then removed so that the structure is undercut. The finished structure is shown in FIG. 6.

The invention claimed is:

1. A semiconductor device comprising a vertical stack of layers comprising:
    an active layer configured to support a two dimensional carrier gas having an excess of carriers;
    source and drain contacts provided to said active layer such that a current can flow between said source and drain contacts through said two dimensional carrier gas;
    a lower conducting region,
    wherein said lower conducting region is a patterned lower conducting region such that said active layer is suspended across gaps in said lower conducting region and said active layer is physically supported by and suspended between parts of said lower conducting region; and
    an upper etch stop layer provided between said lower conducting region and the active layer, said lower conducting region comprising a first material and said upper etch stop layer comprising a second material, wherein said first material is etchable by a first etchant but resistant to a second etchant and said second material is etchable by the second etchant but resistant to etching by the first etchant.

2. A semiconductor device comprising a vertical stack of layers, comprising:
    an active layer configured to support a two dimensional carrier gas having an excess of carriers;
    source and drain contacts provided to said active layer such that a current can flow between said source and drain contacts through said two dimensional carrier gas;
    a lower conducting region,
    wherein said lower conducting region is a patterned lower conducting region such that said active layer is suspended across gaps in said lower conducting region and said active layer is physically supported by and suspended between parts of said lower conducting region; and a lower etch stop layer, said lower etch stop layer being provided on the opposing side of said lower conducting region to said active layer, wherein said lower conducting region comprises a first material and said lower etch stop layer comprises a second material, wherein said first material is etchable by a first etchant but resistant to a second etchant and said second material is etchable by the second etchant but resistant to etching by the first etchant.

3. A semiconductor device comprising a vertical stack of layers, comprising:
an active layer configured to support a two dimensional carrier gas having an excess of carriers;
source and drain contacts provided to said active layer such that a current can flow between said source and drain contacts through said two dimensional carrier gas;
a lower conducting region,
wherein said lower conducting region is a patterned lower conducting region such that said active layer is suspended across gaps in said lower conducting region and said active layer is physically supported by and suspended between parts of said lower conducting region; and
a contact to said lower conducting region and wherein said contact to said lower conducting region is provided in a first lateral part of said device and the source or drain contact is formed in a second lateral part of said device, wherein said lower conducting region is removed in an area between said first and second lateral parts such that first and second parts of said lower conducting region are isolated from one another.

4. A semiconductor device according to claim 1, wherein the lower conducting region comprises a single layer.

5. A semiconductor device comprising a vertical stack of layers, comprising:
an active layer configured to support a two dimensional carrier gas having an excess of carriers;
source and drain contacts provided to said active layer such that a current can flow between said source and drain contacts through said two dimensional carrier gas; and
a lower conducting region,
wherein said lower conducting region is a patterned lower conducting region such that said active layer is suspended across gaps in said lower conducting region and said active layer is physically supported by and suspended between parts of said lower conducting region; and
wherein said lower conducting region is configured as a lower contact region and comprises a three dimensional doped semiconductor layer.

6. A semiconductor device according to claim 1, wherein said lower conducting region is a second active region comprising an active layer configured to support a two dimensional carrier gas with an excess of carriers.

7. A semiconductor device according to claim 1, wherein the first active layer is formed directly in contact with said upper etch stop layer.

8. A semiconductor device comprising a vertical stack of layers, comprising:
an active layer configured to support a two dimensional carrier gas having an excess of carriers;
source and drain contacts provided to said active layer such that a current can flow between said source and drain contacts through said two dimensional carrier gas; and
a lower conducting region,
wherein said lower conducting region is a patterned lower conducting region such that said active layer is suspended across gaps in said lower conducting region and said active layer is physically supported by and suspended between parts of said lower conducting region; and
wherein the active layer is patterned to form an elongate structure and said lower conducting region has at least a part with an elongate shape and wherein said elongate shapes are formed with their major axis substantially perpendicular to one another.

9. A semiconductor according to claim 1, further comprising a front gate provided overlying said active region.

10. A semiconductor device according to claim 1, further comprising a doped barrier layer configured to supply carriers to said active region.

* * * * *